United States Patent
Kamon

(10) Patent No.: US 7,170,682 B2
(45) Date of Patent: Jan. 30, 2007

(54) PROJECTION ALIGNER, ABERRATION ESTIMATING MASK PATTERN, ABERRATION QUANTITY ESTIMATING METHOD, ABERRATION ELIMINATING FILTER AND SEMICONDUCTOR MANUFACTURING METHOD

(75) Inventor: Kazuya Kamon, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/240,379

(22) Filed: Oct. 3, 2005

(65) Prior Publication Data

US 2006/0023309 A1 Feb. 2, 2006

Related U.S. Application Data

(62) Division of application No. 10/321,607, filed on Dec. 18, 2002, now Pat. No. 6,970,291, which is a division of application No. 09/810,477, filed on Mar. 19, 2001, now Pat. No. 6,517,983, which is a division of application No. 08/634,373, filed on Apr. 18, 1996, now Pat. No. 6,245,470.

(30) Foreign Application Priority Data

Dec. 14, 1995 (JP) .................................. 7-325988

(51) Int. Cl.
G02B 5/18 (2006.01)
(52) U.S. Cl. ...................... 359/569; 359/649; 359/743
(58) Field of Classification Search ................ 359/565, 359/569, 576, 648, 649, 662, 724, 741–743; 355/53
See application file for complete search history.

(56) References Cited

U.S. PATENT DOCUMENTS

| | | | |
|---|---|---|---|
| 5,136,413 | A | 8/1992 | MacDonald et al. |
| 5,144,362 | A | 9/1992 | Kamon et al. |
| 5,218,471 | A | 6/1993 | Swanson et al. |
| 5,323,208 | A | 6/1994 | Fukuda et al. |
| 5,348,837 | A | 9/1994 | Fukuda et al. |
| 5,362,585 | A | 11/1994 | Adams |
| 5,396,311 | A | 3/1995 | Fukushima et al. |
| 5,408,083 | A | 4/1995 | Hirukawa et al. |
| 5,444,572 | A | 8/1995 | Gal et al. |
| 5,448,336 | A | 9/1995 | Shiraishi |
| 5,467,166 | A | 11/1995 | Shiraishi |
| 5,610,684 | A | 3/1997 | Shiraishi |

(Continued)

*Primary Examiner*—Mark A. Robinson
*Assistant Examiner*—Alessandro Amari
(74) *Attorney, Agent, or Firm*—Oblon, Spivak, McClelland, Maier & Neustadt, P.C.

(57) ABSTRACT

A projection aligner of the present invention, in which ultraviolet light emitted from a lamp housing is split by a fly-eye lens into a large number of point light sources which are independent of one another. Further, in this projection aligner, the light is shaped by an aperture, so that a secondary light source plane is formed. Moreover, after an exposure area is established by a blind, a photomask is illuminated. Thereafter, an image of a light source is formed on a pupillary surface of a projection optical system from light diffracted by the photomask. Furthermore, a wave front aberration is compensated by an aberration eliminating filter placed on the pupillary surface of the optical system of the projection aligner. Then, the image of a circuit pattern is formed on a wafer. Thereby, the influence of the aberration of the optical system is eliminated. Consequently, the high-accuracy transferring of the pattern can be achieved.

3 Claims, 14 Drawing Sheets

U.S. PATENT DOCUMENTS

| | | |
|---|---|---|
| 5,621,498 A | 4/1997 | Inoue et al. |
| 5,636,000 A | 6/1997 | Ushida et al. |
| 5,636,004 A | 6/1997 | Ootaka et al. |
| 5,684,569 A | 11/1997 | Sugaya et al. |
| 5,719,704 A | 2/1998 | Shiraishi et al. |
| 5,760,879 A | 6/1998 | Shinonaga et al. |
| 5,789,734 A | 8/1998 | Torigoe et al. |
| 5,907,436 A * | 5/1999 | Perry et al. .................. 359/576 |
| 5,914,774 A | 6/1999 | Ota |
| 5,914,822 A | 6/1999 | Maruyama et al. |
| 6,061,188 A | 5/2000 | Kamon |
| 6,245,470 B1 | 6/2001 | Kamon |

* cited by examiner $\phi = -B\rho^4/4$ $\phi = -Cy_0^2\rho^2\cos^2\theta$ $\phi = -Dy_0^2\rho^2/2$ $\phi = Ey_0^3\rho\cos\theta$ $\phi = Fy_0\rho^3$

PROJECTION ALIGNER, ABERRATION ESTIMATING MASK PATTERN, ABERRATION QUANTITY ESTIMATING METHOD, ABERRATION ELIMINATING FILTER AND SEMICONDUCTOR MANUFACTURING METHOD

BACKGROUND OF THE INVENTION

1. Field of the Invention

The present invention relates to a projection aligner for use in a large-scale integrated circuit (LSI) manufacturing process. Moreover, the present invention relates to an aberration estimating (or evaluating) mask pattern for estimating aberration included in an optical system of a projection aligner, an aberration quantity (namely, quantity-of-aberration) estimating method, and an aberration eliminating filter for eliminating the aberration. Furthermore, the present invention relates to a semiconductor manufacturing method for manufacturing a semiconductor device by transferring a circuit pattern while eliminating the aberration.

2. Description of the Related Art

Projection aligners for projecting a circuit pattern of a semiconductor device, which is formed on a mask, onto a wafer are required to have high resolution so as to achieve the transferring of a micro or fine pattern thereon. Generally, in proportion as the numerical aperture (NA) of a projection lens (or projecting lens) increases, or in proportion as the wavelength of exposure light decreases, the resolution is improved. The method of increasing the NA of the projection lens, however, causes a reduction in the focal depth (namely, the depth of focus) thereof at the time of transferring the pattern. Thus, there is a limit to the improvement of the resolution. On the other hand, the use of exposure light having short wavelength requires an extensive modification of the transferring process. The method of decreasing the wavelength of exposure light is, therefore, unpractical.

Thus, in Japanese Patent Laid-Open Nos. 4-251914 and 4-179213, there have been proposed projection aligners, by each of which the resolution can be enhanced by increasing the NA but, simultaneously, the focal depth can be enlarged, by the applicant of the present application. As illustrated in FIG. 19, in this projection aligner, a fly-eye lens 3 is placed diagonally to the front of a lamp house or lamp housing 1 by interposing a mirror 2 therebetween. Further, an aperture 4 is positioned in front of the fly-eye lens 3. Moreover, a blind 6 is placed in front of the aperture 4 by putting a condensing lens or condenser lens 5 therebetween. Furthermore, a photomask 10, on which a desired circuit pattern is formed, is disposed diagonally to the front of the blind 6 by interposing a condensing lens 7, a mirror 8 and a condensing lens 9 therebetween. In addition, a wafer 12 is placed in front of the photomask 10 by interposing a projection optical system or projecting lens system 11 therebetween. The contrast of an image at the time of defocusing is improved by putting a phase shift member, which is operative to cause a phase difference between light passing through the central portion of a transmitting zone or area and light passing though the peripheral area thereof, onto the pupillary surface or pupil plane of the projection optical system 11. Consequently, the focal depth is increased effectively.

However, in the case of the aforementioned conventional projection aligner, the aberration of the optical system is not taken into consideration. Generally, actual or practical optical systems have various aberrations. Typical aberrations are a spherical aberration, an astigmatism aberration, a field curvature and a coma aberration. It is known that theses aberrations can be expressed, as illustrated in FIGS. 20A to 20E, by being converted into wavefront aberrations, respectively. In these figures, $\phi$ denotes a shift quantity or distance of a wavefront; $\rho$ a radius on a pupillary surface (namely, a $\eta\xi$-plane); $\theta$ an angle of rotation with respect to the axis $\eta$; $y_0$ coordinates on a wafer surface; and B to F constants. The details of these aberrations are described in various literatures, for example, "Principle of Optics I to III" (published by Tokai University Press.).

Because the optical systems of the conventional projection aligners have such aberrations, the conventional projection aligners have the problems that the image quality thereof is degraded and that the accuracy of transferring a circuit pattern is deteriorated.

The present invention is accomplished to solve such problems of the conventional projection aligners.

SUMMARY OF THE INVENTION

Accordingly, an object of the present invention is to provide a projection aligner which can eliminate the influence of the aberrations of the optical system thereof and can achieve the high-accuracy transfer of a (circuit) pattern.

Moreover, another object of the present invention is to provide an aberration estimating mask pattern for estimating the aberration of the optical system of a projection aligner, and to further provide a method for estimating an aberration quantity by using this aberration estimating mask pattern.

Furthermore, still another object of the present invention is to provide an aberration eliminating filter for compensating for an aberration of the optical system of the projection aligner.

Additionally, yet another object of the present invention is to provide a semiconductor manufacturing method for manufacturing a semiconductor device by transferring a circuit pattern while eliminating the influence of the aberration of the optical system of a projection aligner.

To achieve the foregoing objects, in accordance with an aspect of the present invention, there is provided a projection aligner which comprises: a light source; an aperture for shaping illumination light and forming a secondary light source plane; a blind having an opening portion for setting an exposure area; a photomask which has a circuit pattern and is illuminated with illumination light emanating from the secondary light source plane; a projection optical system for projecting a circuit pattern of the photomask by forming an image on an exposed substrate from diffraction light diffracted by the photomask; and an aberration eliminating filter, placed on a pupillary surface of the projection optical system, for eliminating an aberration.

Further, in accordance with another aspect of the present invention, there is provided an aberration estimating mask pattern which comprises: a transparent substrate; a plurality of micro patterns selectively formed on the transparent substrate; and a plurality of larger patterns which are formed selectively on the transparent substrate. Further, in this aberration estimating mask pattern, each of the micro patterns and a corresponding one of the larger patterns are combined with each other. Furthermore, a plurality of such combinations (or sets) of micro patterns and a larger pattern are placed on the transparent substrate.

Moreover, in accordance with a further aspect of the present invention, there is provided an aberration quantity (namely, a quantity-of-aberration) estimating method which comprises the steps of: exposing aberration estimating mask patterns; observing a plurality of finished (or obtained)

patterns; finding a best focus position or a finishing position of each of the patterns; and estimating a quantity of an aberration from a quantity of a change in the best focus position or in the finishing position of each of the patterns.

Furthermore, in accordance with yet another aspect of the present invention, there is provided an aberration eliminating filter that is a filter, which is placed on a pupillary surface (namely, a pupil plane) of a projection optical system, for eliminating an aberration. This filter is provided with a transparent substrate and a wavefront regulating (or adjusting) transparent multi-layer film formed on at least one principal plane.

Additionally, in accordance with a further aspect of the present invention, there is provided a semiconductor manufacturing method which comprises the steps of: forming a secondary light source plane by shaping illumination light emanating from a light source; establishing an exposure area; illuminating a photomask with illumination light emanating from a secondary light source plane; forming an image of a light source on a pupillary surface from light diffracted by the mask; compensating a wavefront aberration on the pupillary surface of a projection optical system; and manufacturing a semiconductor device by projecting a circuit pattern onto a wafer.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DESCRIPTION OF THE PREFERRED EMBODIMENTS

Hereinafter, the preferred embodiments of the present invention will be described in detail by referring to the accompanying drawings.

Figure 1:
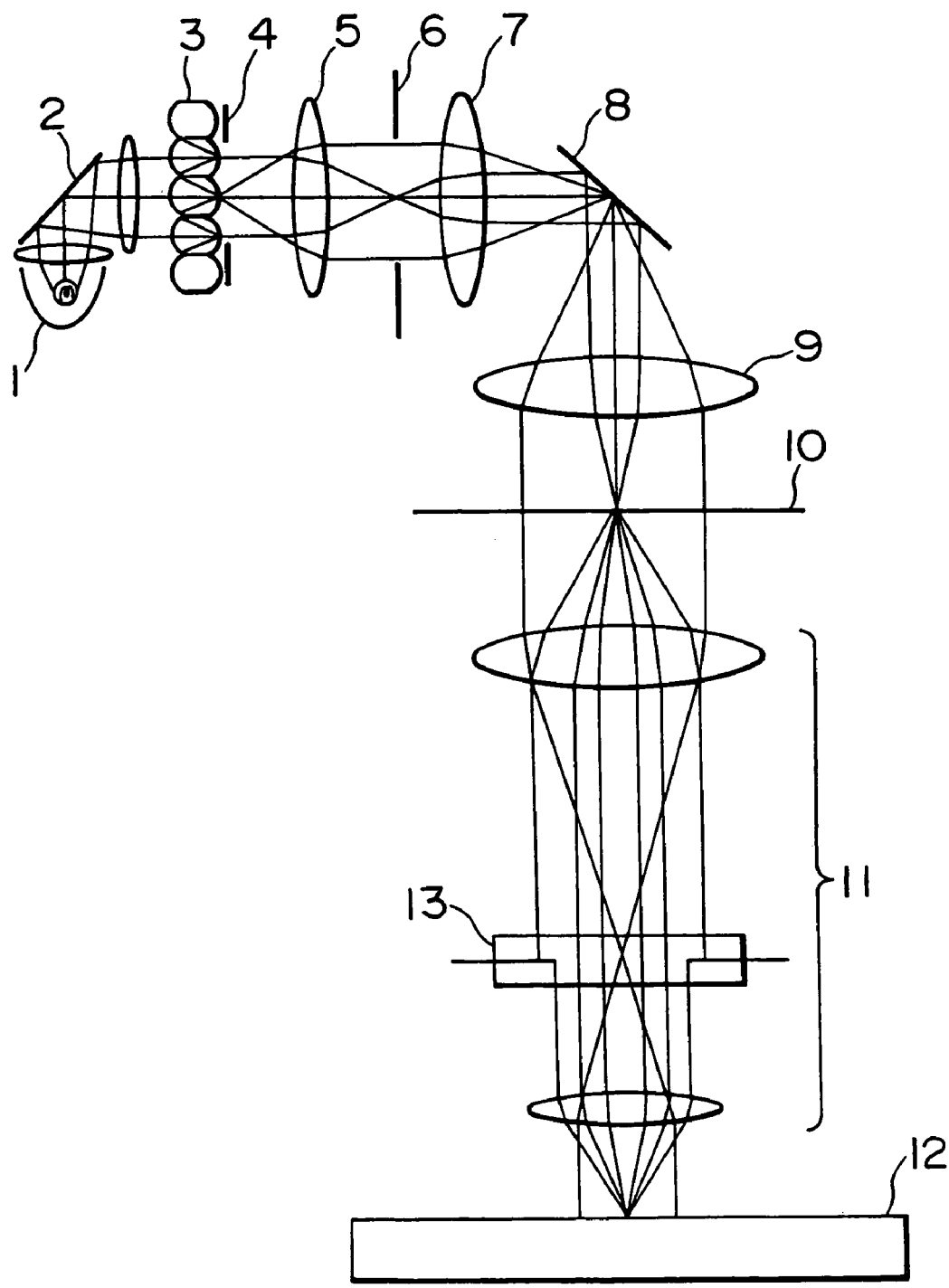
FIG. 1 is a diagram for illustrating the configuration of a projection aligner embodying the present invention, namely, Embodiment 1 of the present invention.

Embodiment 1:

FIG. 1 is a diagram for illustrating the configuration of a projection aligner embodying the present invention, namely, Embodiment 1 of the present invention. As illustrated in this figure, in this projection aligner, a fly-eye lens 3 is placed diagonally to the front of a lamp housing or house 1 by putting a mirror 2 therebetween. Further, an aperture 4 is positioned in front of the fly-eye lens 3. Moreover, a blind 6 is disposed in front of the aperture 4 by placing a condensing lens 5 therebetween. Furthermore, a photomask 10, on which a desired circuit pattern is formed, is placed diagonally to the front of the blind 6 by interposing the condensing lens 7, a mirror 8 and a condensing lens 9 therebetween. In addition, a wafer 12, from which an exposed substrate is obtained, is placed diagonally to the front of the photomask 10 by putting a projection optical system 11 therebetween. Further, an aberration eliminating filter 1 for compensating for aberrations of the projection optical system 11 is put on the pupillary surface or pupil plane of the projection optical system. Incidentally, a light source emanating ultraviolet light, such as a mercury vapor lamp or an excimer laser, is used in the lamp housing 1.

Next, a semiconductor manufacturing method using this projection aligner will be described hereinbelow. Ultraviolet light emitted from the lamp housing 1 reaches the fly-eye lens 3 through the mirror 2. Hereupon, the ultraviolet light is split into a large number of point light sources (namely, light beams) which are independent of one another. Then, the light rays emanating from these point light sources are shaped by the aperture 4, so that a secondary light source plane is formed. Thereafter, an exposure area is established by the blind 6. Moreover, the photomask 10 is illuminated through the condensing lenses 5, 7 and 8. Thus, an image of the light source is formed on the pupillary surface of the projection optical system 11 from the light diffracted by the photomask 10. Here, the aberration eliminating filter 13 is placed on the pupillary surface of the projection optical system 11. Consequently, the wavefront aberration is compensated for on the pupillary surface. Thus, an image of a circuit pattern is formed on the wafer 12 from the diffracted light, the aberration of which is compensated for. At that time, the aberration is compensated for on the pupillary surface of the projection optical system by the aberration eliminating filter 13. Consequently, ill effects due to the aberrations can be removed. Thereby, good image characteristics can be obtained.

In this way, a circuit pattern is transferred onto the surface of the wafer 12. Further, after undergoing various processes such as a thin film deposition process, an etching process and an impurity diffusion process, a semiconductor device is produced.

Figure 2:
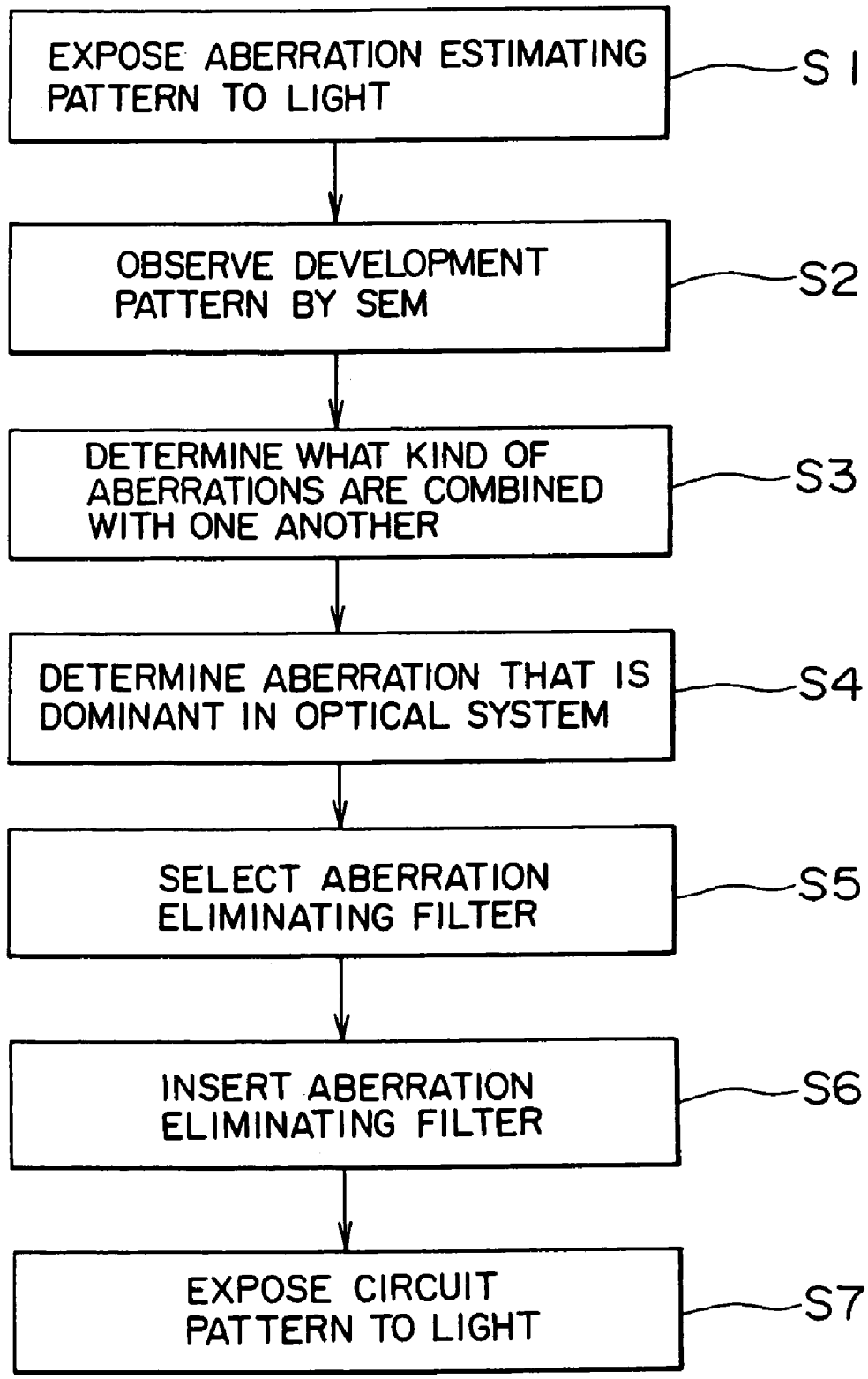
FIG. 2 is a flowchart for illustrating a projection exposure method embodying the present invention, namely, Embodiment 2 of the present invention.

Embodiment 2:

A projection exposure method embodying the present invention, namely, Embodiment 2 of the present invention is illustrated by the flowchart of FIG. 2. First, in step S1, an aberration estimating pattern is exposed to light so as to estimate or evaluate aberrations of an optical system. Next, in step S2, a post-exposure pattern or development pattern obtained by the exposure is observed through a SEM (Scanning Electron Microscope). As a result of this observation, it is determined what kinds or classifications of aberrations are combined with one another (namely, are contained or included) and occur in the optical system. Further, it is determined in step S4 what kind of the aberration is dominant between or among the aberrations of the projection optical system. In subsequent step S5, an aberration eliminating filter for compensating for the dominant aberration is selected. Then, the aberration eliminating filter selected in this way is inserted in (namely, is put onto) the pupillary surface of the projection optical system in step S6. Subsequently, a circuit pattern is exposed to light in step S7.

Thus, the aberration, which is dominant in the projection optical system, can be selectively eliminated and good image characteristics can be obtained by employing such an exposure method.

Figure 3A:
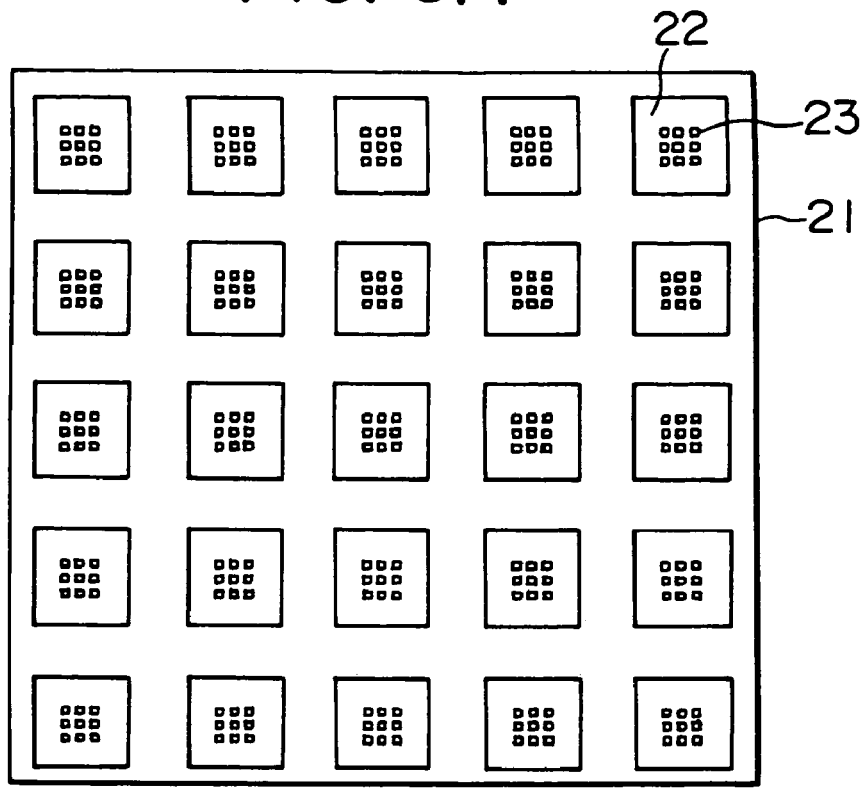
FIG. 3A is a plan view of an aberration estimating mask pattern embodying the present invention, namely, Embodiment 3 of the present invention.

Embodiment 3:

The aberration estimating mask used in the exposure method of Embodiment 2 is illustrated in FIG. 3A. As shown in this figure, twenty-five rectangular larger patterns 22 in total, which are placed in five columns and five rows, are formed on a transparent substrate 21. Further, in each of the larger patterns 22, nine micro patterns 23 in total, which are placed in three columns and three rows, are formed. Each of the larger patterns 22 has a dimension which is three times the exposure wavelength or so. Namely, twenty-five combinations of each of the larger patterns 22 and the micro patterns 23 arranged therein are placed on the transparent substrate 21.

Figure 3B:
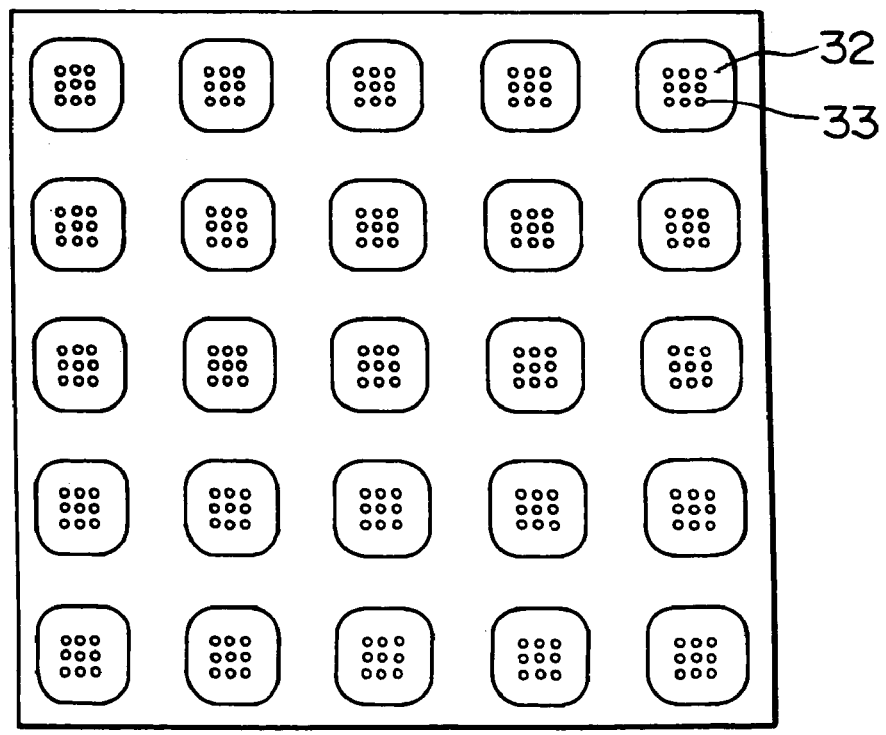
FIG. 3B is a diagram for illustrating a transferred pattern which is obtained when exposing the mask pattern of FIG. 3A.

When this aberration eliminating mask pattern is exposed to light by means of an aplanatic lens, the corners of each of the larger patterns are rounded off owing to the diffraction. Thus, a transferring pattern, which contains larger patterns 32 and micro patterns 33 as shown in FIG. 3B, is obtained. Generally, micro patterns are sensitive to aberrations, whereas large patterns are insensitive to aberrations. Thus, lens aberrations can be classified into five kinds easily and clearly by observing the larger patterns 32 and the micro patterns 33 contained in the transferring pattern.

Figure 4A:
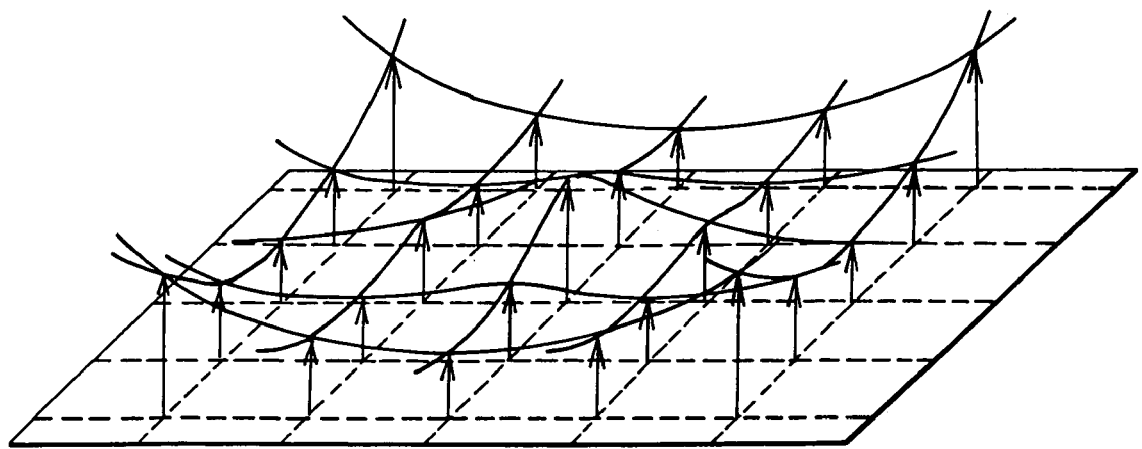
FIGS. 4A and 4B are diagrams for illustrating the best focus positions of a micro pattern and that of a larger pattern, respectively, which are obtained according to a spherical aberration estimating method embodying the present invention, namely, Embodiment 4 of the present invention.
Figure 4B:
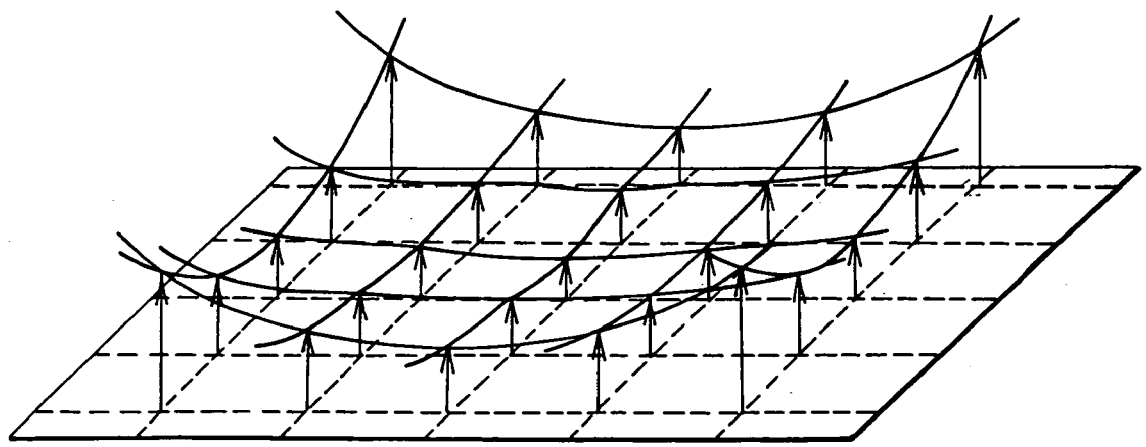

Embodiment 4:

A method for estimating a spherical aberration by using the aberration estimating mask pattern of FIG. 3A will be described hereinbelow. First, the aberration estimating mask pattern is exposed to light by changing the focusing conditions thereof. Then, finished twenty-five transferring patterns are observed by means of a SEM or the like. Thereby, as illustrated in FIG. 4A, the best focus positions of the micro patterns 33 are obtained at twenty-five points. Moreover, as illustrated in FIG. 4B, the best focus positions of the larger patterns 32 are obtained at twenty-five points.

At that time, if it is observed that the best focus position is shifted among the micro patterns 33 and the larger patterns 32, a spherical aberration of an exposure optical system proves to be present therein. Moreover, the quantity of the spherical aberration can be estimated from the quantity of the shift of the best focus position among the micro patterns 33 and the larger patterns 32.

Figure 5A:
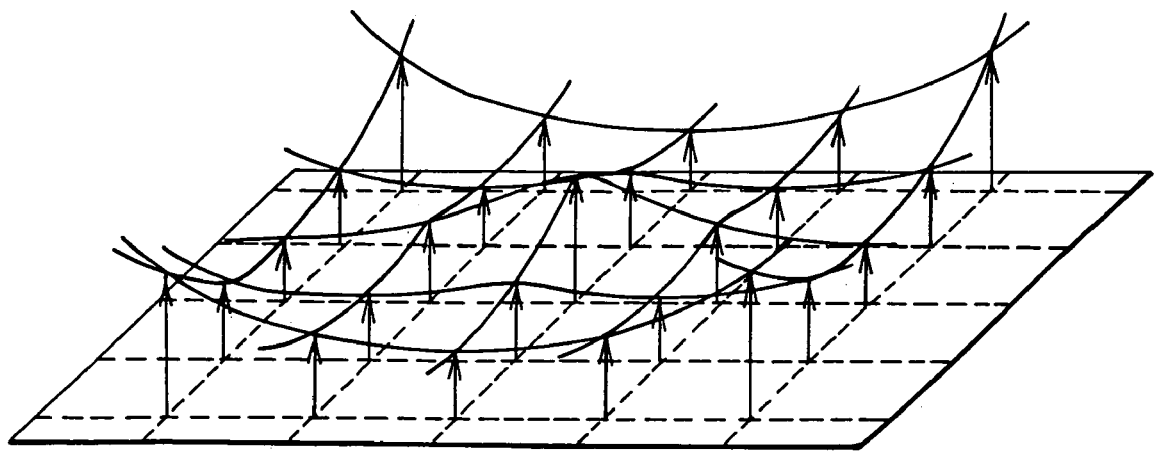
FIGS. 5A and 5B are diagrams for illustrating the best focus positions of a lateral pattern element (namely, a lateral pattern side) and that of a longitudinal pattern element (namely, a longitudinal pattern side), respectively, which are obtained according to an astigmatism estimating method embodying the present invention, namely, Embodiment 5 of the present invention.
Figure 5B:
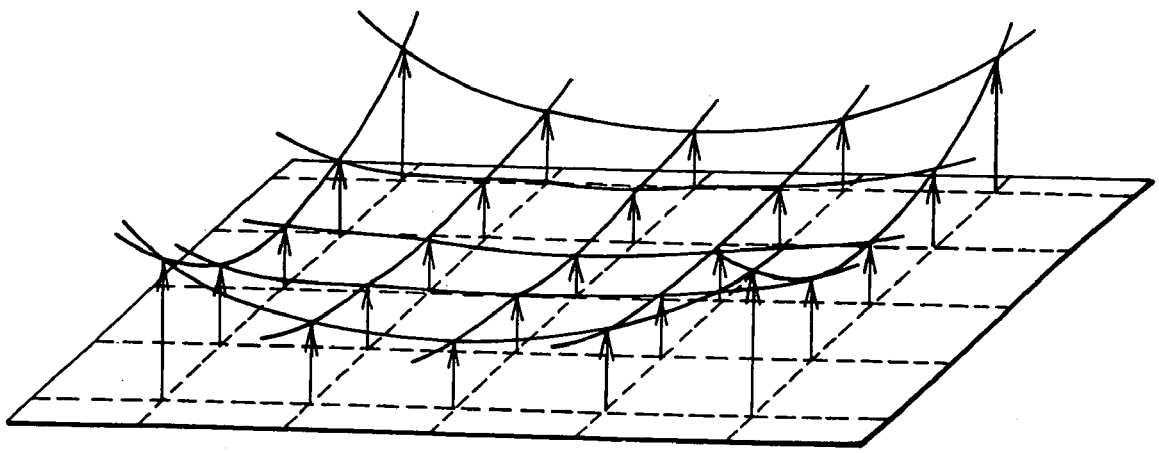

Embodiment 5:

A method for estimating an astigmatism aberration by using the aberration estimating mask pattern of FIG. 3A will be described hereunder. First, the aberration estimating mask pattern is exposed to light by changing the focusing conditions. Then, twenty-five finished transferring patterns are observed by means of a SEM or the like. Thereby, the best focus position of a lateral pattern element (or side) of each pattern is obtained at each of twenty-five points, as illustrated in FIG. 5A. Moreover, the best focus position of a longitudinal pattern element (or side) of each pattern is obtained at each of the twenty-five points, as illustrated in FIG. 5B.

At that time, if it is observed that the best focus position is shifted between the lateral pattern element and the longitudinal pattern element, an astigmatism aberration of an exposure optical system proves to be present therein. Moreover, the quantity of the astigmatism aberration can be estimated from a quantity of a shift (or variation) of the best focus position between the lateral pattern element and the longitudinal pattern element.

Figure 6A:
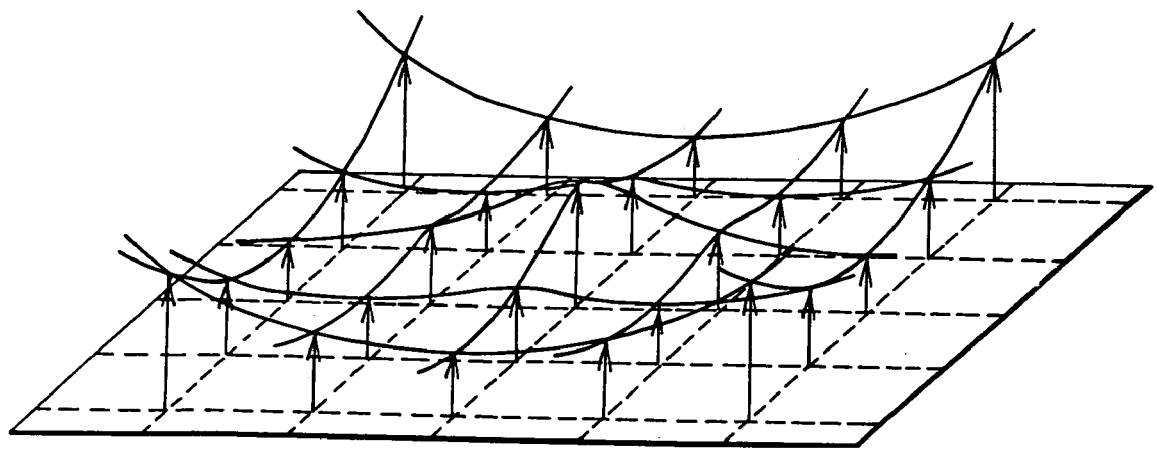
FIGS. 6A and 6B are diagrams for illustrating the best focus positions of a micro pattern and that of a larger pattern, respectively, which are obtained according to a field curvature estimating method embodying the present invention, namely, Embodiment 6 of the present invention.
Figure 6B:
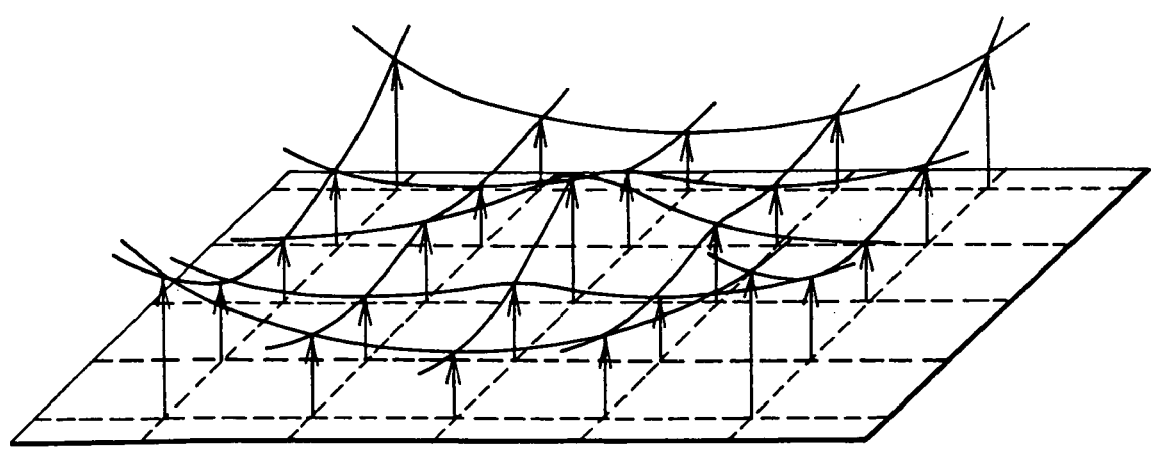

Embodiment 6:

A method for estimating a field curvature by using the aberration estimating mask pattern of FIG. 3A will be described hereinbelow. First, the aberration estimating mask pattern is exposed to light by changing the focusing conditions thereof. Then, finished twenty-five transferring patterns are observed by means of a SEM or the like. Thereby, as illustrated in FIG. 6A, the best focus positions of the micro patterns 23 are obtained at twenty-five points, respectively. Moreover, as illustrated in FIG. 6B, the best focus positions of the larger patterns 22 are obtained at twenty-five points, respectively.

At that time, if it is observed that the best focus position of the micro pattern 33 coincides with that of the corresponding larger pattern 32 at each of the twenty-five points but the best focus positions vary depending on the exposed position, for example, vary among the larger patterns 32 placed at the twenty-five points, a field curvature of an exposure optical system proves to be present. Incidentally, the quantity of the field curvature can be estimated from the quantity of the variation in the best focus position among the larger patterns 32.

Figure 7:
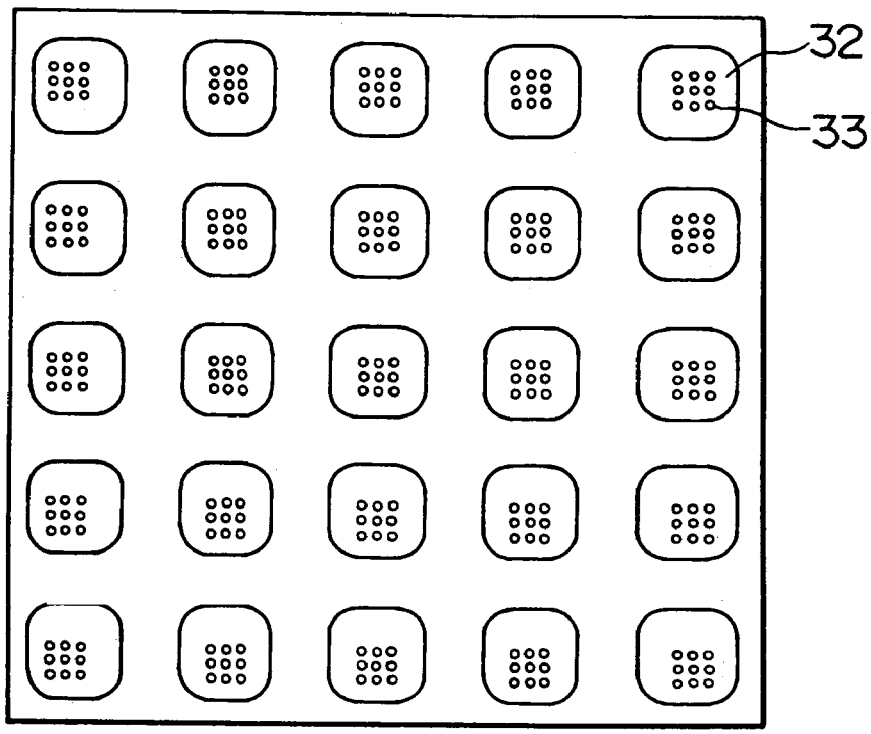
FIG. 7 is a diagram which shows a transferring pattern for illustrating a coma (aberration) estimating method embodying the present invention, namely, Embodiment 7 of the present invention.

Embodiment 7:

A method for estimating a coma aberration by using the aberration estimating mask pattern of FIG. 3A will be described hereinbelow. The aberration estimating mask pattern is fist exposed to light by changing the focusing conditions thereof. Then, twenty-five transferring patterns finished as shown in FIG. 7 are observed by means of a SEM or the like. Thereby, the finished positions of the micro patterns 33 are obtained at twenty-five points, respectively.

At that time, if it is observed that the finished positions of the micro patterns 33 vary with respect to the finished position of the corresponding larger pattern 32 as illustrated in FIG. 7, a coma aberration of an exposure optical system proves to be present therein. Moreover, the quantity of the coma aberration can be estimated from the quantity or distance of a relative shift between the finished position of one of the larger patterns 32 and that of one of the corresponding micro patterns 33 combined with the one of the larger patterns 32.

Figure 8:
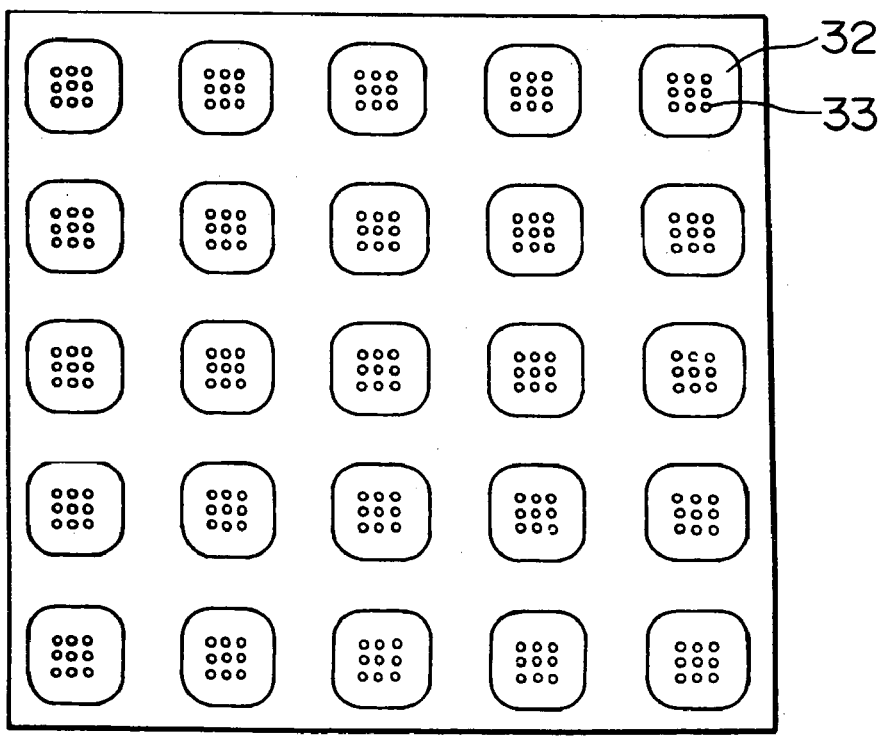
FIG. 8 is a diagram which shows a transferring pattern for illustrating a distortion aberration estimating method embodying the present invention, namely, Embodiment 8 of the present invention.

Embodiment 8:

A method for estimating a distortion aberration by using the aberration estimating mask pattern of FIG. 3A will be described hereinbelow. The aberration estimating mask pattern is first exposed to light by changing the focusing conditions thereof. Then, twentyfive transferring patterns finished as shown in FIG. 8 are observed by means of a SEM or the like. Consequently, the finished positions of the micro patterns 33 are obtained at twenty-five points, respectively.

At that time, if it is observed that although the relative finished position of each of the larger pattern 32 with respect to the finished position of each of the corresponding micro patterns 33 is maintained (or unchanged), the finished positions of, for example, the larger patterns 32 vary depending on the exposed positions thereof among the patterns 32 respectively corresponding to the twenty-five points, as illustrated in FIG. 8, a distortion aberration of an exposure optical system proves to be present therein. Moreover, the quantity of the distortion aberration can be estimated from the quantities or distances of shifts of the finished positions of the larger patterns 32.

Embodiment 9:

A transparent substrate, on at least one principal plane of which a transparent multi-layer film for regulating a wavefront is formed, can be used as the aberration eliminating filter 13 used in the projection aligner of Embodiment 1, the aforesaid semiconductor manufacturing method of the present invention, or the projection exposure method of Embodiment 2. The transparent multi-film has a film thickness distribution, by which the wavefront shift occurring due to the aberration of a projection optical system can be compensated for.

Figure 9A:
FIGS. 9A and 9B are a sectional view and a perspective view of an aberration eliminating filter embodying the present invention, namely, Embodiment 10 of the present invention for compensating a positive spherical aberration.
Figure 9B:
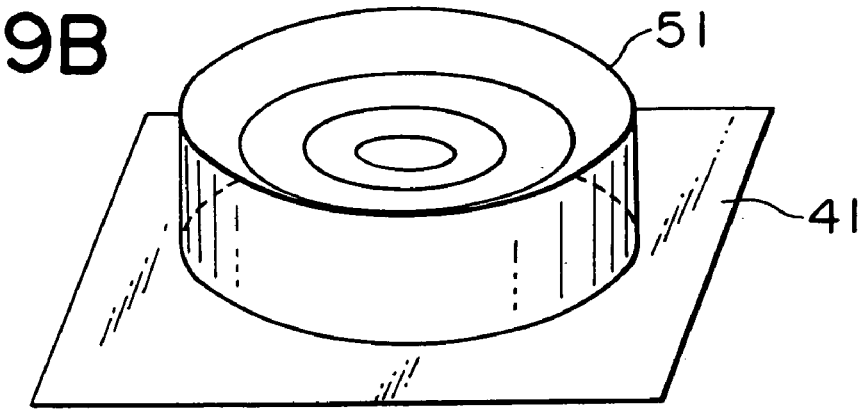
Figure 20A:
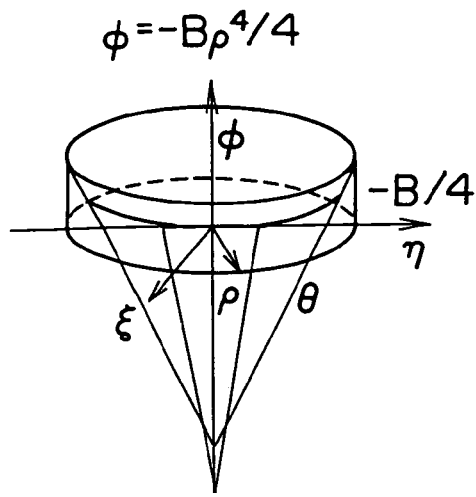
FIGS. 20A to 20E are diagrams for illustrating a spherical aberration, an astigmatism aberration, a field curvature, a distortion aberration and a coma aberration on a pupil, respectively.

Embodiment 10:

An aberration eliminating filter for compensating for positive spherical aberrations is illustrated in FIGS. 9A and 9B, as a practical example of the aberration eliminating filter of Embodiment 9. As shown in these figures, in the case of this aberration eliminating filter, a transparent multi-layer film 51 is formed on the surface of a transparent substrate 41. As illustrated in FIG. 20A, if a spherical aberration is converted into a wavefront aberration on a pupillary surface, the quantity $\phi$ of a shift of the wavefront is represented or given by an equation $\phi=-B\rho^4/4$. Thus, the transparent multi-layer film 51 for compensating for positive spherical aberrations is shaped like a mortar (namely, is cone-shaped) and has concentric-ring-like layers as illustrated in FIG. 9B, and further has a longitudinal section, whose shape is like that of a section of the mortar and is represented by a positive quartic function as shown in FIG. 9A. A positive spherical aberration can be eliminated by putting this aberration eliminating filter onto the pupillary surface of the projection optical system. Consequently, the image quality can be improved.

Figure 10A:
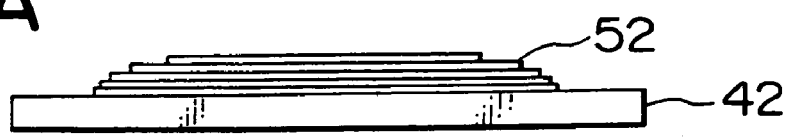
FIGS. 10A and 10B are a sectional view and a perspective view of an aberration eliminating filter embodying the present invention, namely, Embodiment 11 of the present invention for compensating a negative spherical aberration.
Figure 10B:
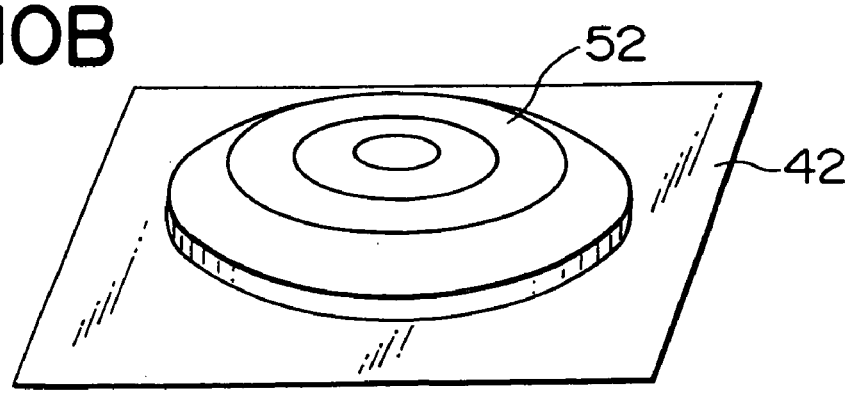

Embodiment 11:

An aberration eliminating filter for compensating for negative spherical aberrations is illustrated in FIGS. 10A and 10B, as a practical example of the aberration eliminating filter of Embodiment 9. As shown in these figures, in the case of this aberration eliminating filter, a transparent multi-layer film 52 is formed on the surface of a transparent substrate 42. As illustrated in FIG. 20A, if a spherical aberration is converted into a wavefront aberration on a pupillary surface, the quantity $\phi$ of a shift of the wavefront is expressed or obtained by an equation $\phi=-B\rho^4/4$. Thus, the transparent multi-layer film 52 for compensating for negative spherical aberrations is shaped like a dome and has concentric-circle-like layers as illustrated in FIG. 10B, and further has a longitudinal section, whose shape is like that of a section of the dome and is represented by a negative quartic function as shown in FIG. 10A. A negative spherical aberration can be eliminated by putting this aberration eliminating filter onto the pupillary surface of the projection optical system. Consequently, the image quality can be enhanced.

Figure 11A:
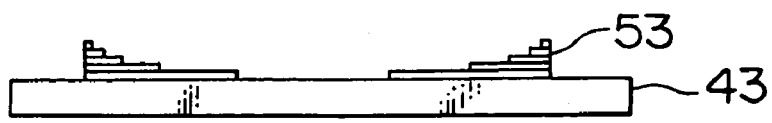
FIGS. 11A and 11B are a sectional view and a perspective view of an aberration eliminating filter embodying the present invention, namely, Embodiment 12 of the present invention for compensating a positive astigmatism aberration.
Figure 11B:
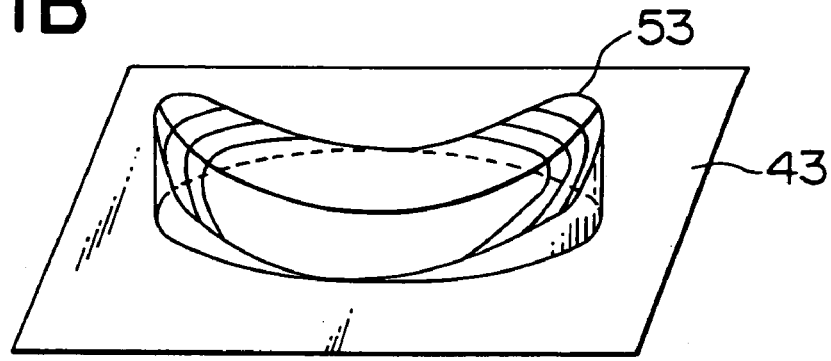
Figure 20B:
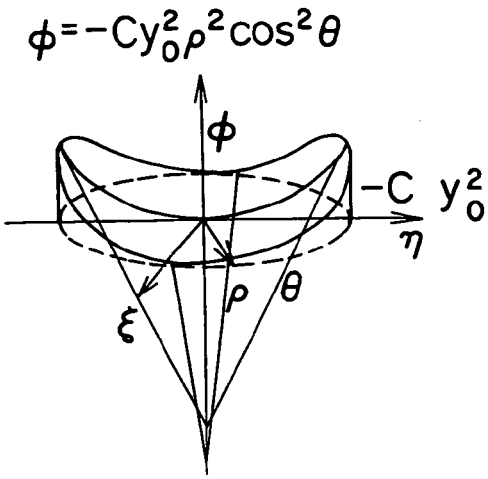

Embodiment 12:

An aberration eliminating filter for compensating for positive astigmatism aberrations is illustrated in FIGS. 11A and 11B, as a practical example of the aberration eliminating filter of Embodiment 9. As shown in these figures, in the case of this aberration eliminating filter, a transparent multi-layer film 53 is formed on the surface of a transparent substrate 43. As illustrated in FIG. 20B, if an astigmatism aberration is converted into a wavefront aberration on a pupillary surface, the quantity $\phi$ of a shift of the wavefront is expressed by an equation $\phi=-Cy_0\rho^2\cos^2\theta$. Thus, the transparent multi-layer film 53 for compensating for positive astigmatism aberrations has a shape concaved like a mortar only in one direction, namely, is shaped like a saddle as illustrated in FIG. 20B, and further has a longitudinal section, whose shape is like that of a section of a mortar only in a direction and is represented by a positive quadratic function as shown in FIG. 11A. A positive astigmatism aberration can be eliminated by putting this aberration eliminating filter onto the pupillary surface of the projection optical system. Consequently, the image quality can be improved.

Figure 12A:
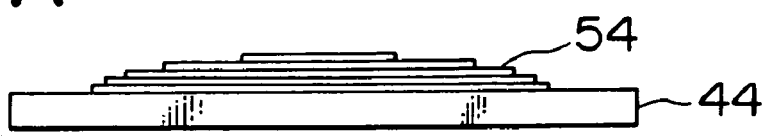
FIGS. 12A and 12B are a sectional view and a perspective view of an aberration eliminating filter embodying the present invention, namely, Embodiment 13 of the present invention for compensating a negative astigmatism aberration.
Figure 12B:
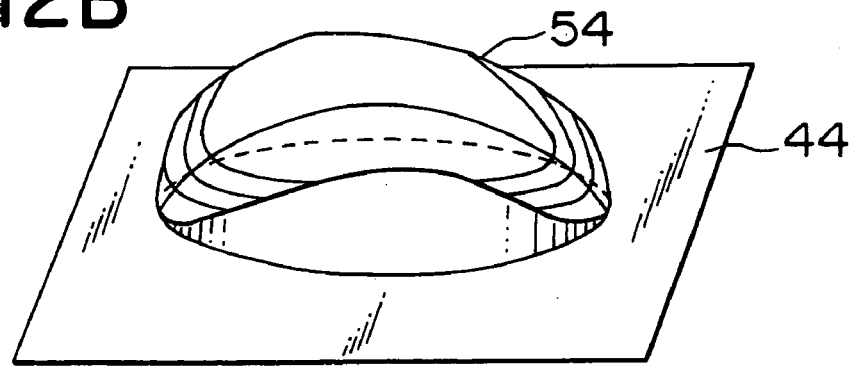

Embodiment 13:

An aberration eliminating filter for compensating for negative astigmatism aberrations is illustrated in FIGS. 12A and 12B, as a practical example of the aberration eliminating filter of Embodiment 9. As shown in these figures, in the case of this aberration eliminating filter, a transparent multi-layer film 54 is formed on the surface of a transparent substrate 44. As illustrated in FIG. 20B, if an astigmatism aberration is converted into a wavefront aberration on a pupillary surface, the quantity $\phi$ of a shift of the wavefront is expressed by an equation $\phi = -Cy_0 \rho^2 \cos^2 \theta$. Thus, the transparent multi-layer film 53 for compensating for positive astigmatism aberrations has a shape which is convex like a dome only in one direction as illustrated in FIG. 20B, and further has a longitudinal section, whose shape is like that of a section of the dome only in a direction and is represented by a negative quadratic function as shown in FIG. 11A. A negative astigmatism aberration can be eliminated by putting this aberration eliminating filter onto the pupillary surface of the projection optical system. Consequently, the image quality can be improved.

Figure 13A:
FIGS. 13A and 13B are a sectional view and a perspective view of an aberration eliminating filter embodying the present invention, namely, Embodiment 14 of the present invention for compensating a positive field curvature.
Figure 13B:
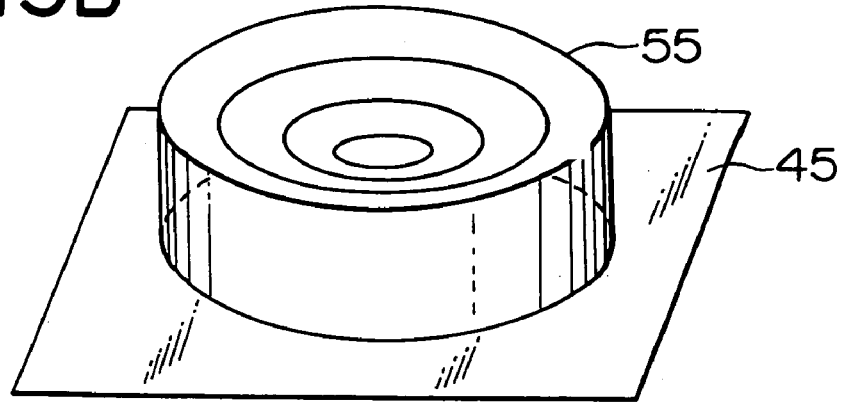
Figure 20C:
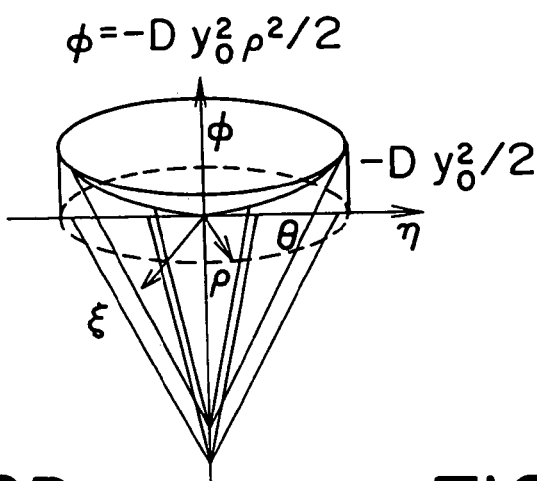

Embodiment 14:

An aberration eliminating filter for compensating for positive field curvatures is illustrated in FIGS. 13A and 13B, as a practical example of the aberration eliminating filter of Embodiment 9. As shown in these figures, in the case of this aberration eliminating filter, a transparent multi-layer film 55 is formed on the surface of a transparent substrate 45. As illustrated in FIG. 20C, if a field curvature aberration is converted into a wavefront aberration on a pupillary surface, the quantity $\phi$ of a shift of the wavefront is expressed by an equation $\phi = -Dy_0^2 \rho^2 / 2$. Thus, the transparent multi-layer film 55 for compensating for positive field curvatures is shaped like a mortar and has concentric-ring-like layers as illustrated in FIG. 13B, and further has a longitudinal section, whose shape is like that of a section of the mortar and is represented by a positive quadratic function as shown in FIG. 13A. A positive field curvature can be eliminated by putting this aberration eliminating filter onto the pupillary surface of the projection optical system. Consequently, the image quality can be improved.

Figure 14A:
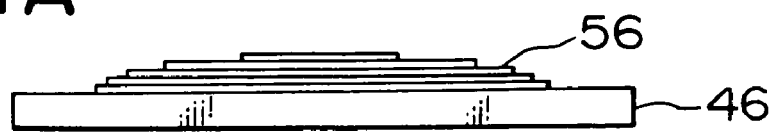
FIGS. 14A and 14B are a sectional view and a perspective view of an aberration eliminating filter embodying the present invention, namely, Embodiment 15 of the present invention for compensating a negative field curvature.
Figure 14B:
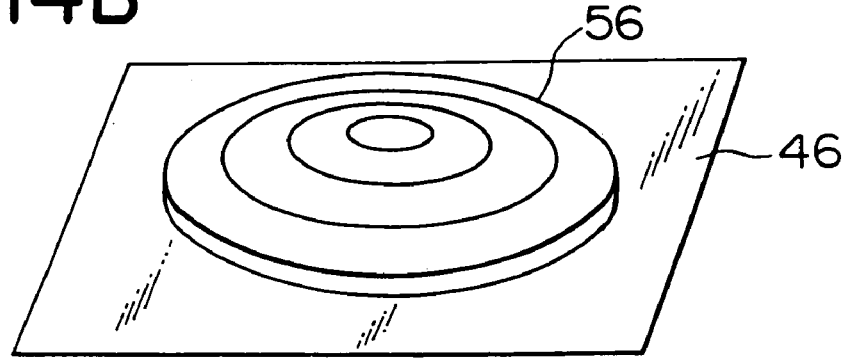

Embodiment 15:

An aberration eliminating filter for compensating for negative field curvatures is illustrated in FIGS. 14A and 14B, as a practical example of the aberration eliminating filter of Embodiment 9. As shown in these figures, in the case of this aberration eliminating filter, a transparent multi-layer film 56 is formed on the surface of a transparent substrate 46. As illustrated in FIG. 20C, if a field curvature is converted into a wavefront aberration on a pupillary surface, the quantity $\phi$ of a shift of the wavefront is expressed by an equation: $\phi = -Dy_0^2 \rho^2 / 2$. Thus, the transparent multi-layer film 55 for compensating for negative field curvatures is shaped like a dome and has concentric-circle-like layers as illustrated in FIG. 14B, and further has a longitudinal section, whose shape is like that of a section of the dome and is represented by a negative quadratic function as shown in FIG. 14A. A negative field curvature can be eliminated by putting this aberration eliminating filter onto the pupillary surface of the projection optical system. Consequently, the image quality can be improved.

Figure 15A:
FIGS. 15A and 15B are a sectional view and a perspective view of an aberration eliminating filter embodying the present invention, namely, Embodiment 16 of the present invention for compensating a distortion aberration.
Figure 15B:
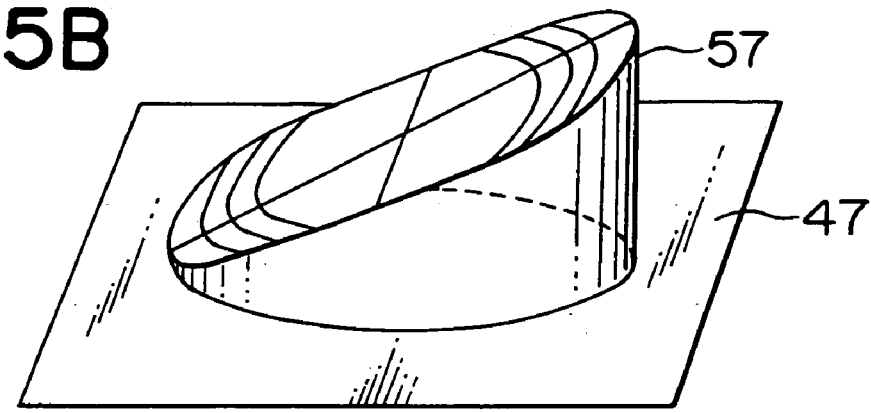
Figure 20D:
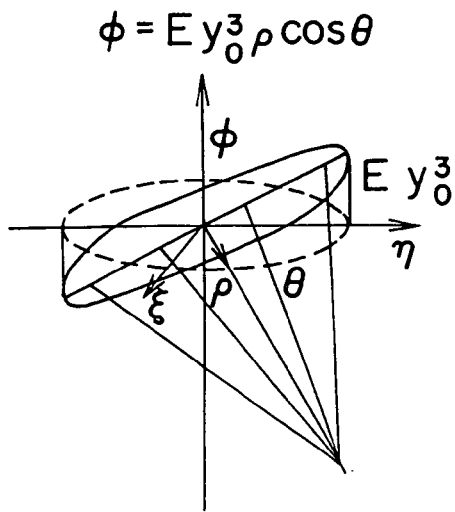

Embodiment 16:

An aberration eliminating filter for compensating for distortion aberrations is illustrated in FIGS. 15A and 15B, as a practical example of the aberration eliminating filter of Embodiment 9. As shown in these figures, in the case of this aberration eliminating filter, a transparent multi-layer film 57 is formed on the surface of a transparent substrate 47. As illustrated in FIG. 20D, if a distortion aberration is converted into a wavefront aberration on a pupillary surface, the quantity $\phi$ of a shift of the wavefront is expressed by an equation $\phi = Ey_0^3 \rho \cos \theta$. Thus, the transparent multi-layer film 57 for compensating for distortion aberrations has a shape like a plane inclined only in one direction as illustrated in FIG. 15B, and further has a longitudinal section, whose shape is like that of a section of the inclined plane represented by a linear function as shown in FIG. 15A. A distortion aberration can be eliminated by putting this aberration eliminating filter onto the pupillary surface of the projection optical system. Consequently, the image quality can be improved.

Figure 16A:
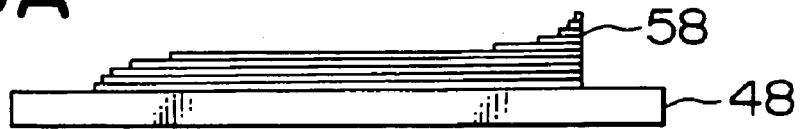
FIGS. 16A and 16B are a sectional view and a perspective view of an aberration eliminating filter embodying the present invention, namely, Embodiment 17 of the present invention for compensating a coma aberration.
Figure 16B:
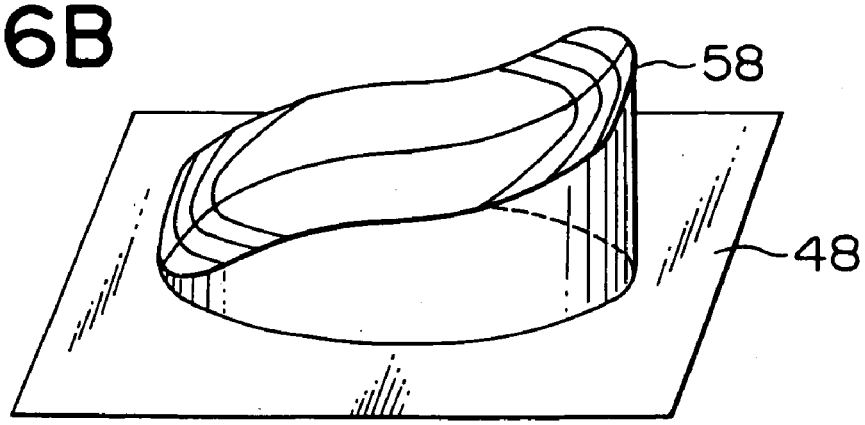
Figure 20E:
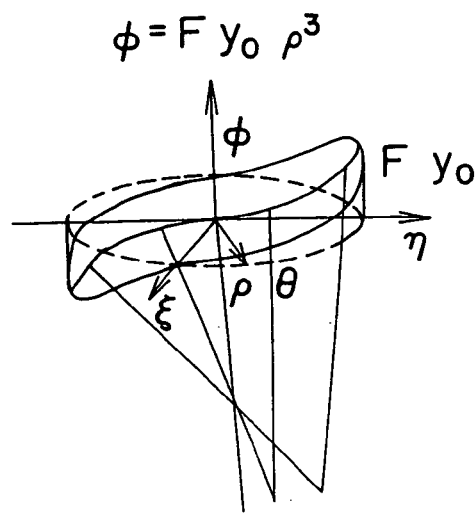

Embodiment 17:

An aberration eliminating filter for compensating for coma aberrations is illustrated in FIGS. 16A and 16B, as a practical example of the aberration eliminating filter of Embodiment 9. As shown in these figures, in the case of this aberration eliminating filter, a transparent multi-layer film 58 is formed on the surface of a transparent substrate 48. As illustrated in FIG. 20E, if a distortion aberration is converted into a wavefront aberration on a pupillary surface, the quantity $\phi$ of a shift of the wavefront is expressed by an equation $\phi = Fy_0 \rho^3$. Thus, the transparent multi-layer film 57 for compensating for coma aberrations is shaped like a slope inclined only in one direction as illustrated in FIG. 16B, and further has a longitudinal section, whose shape is that of the slope represented by a cubic function as shown in FIG. 16A. A coma aberration can be eliminated by putting this aberration eliminating filter onto the pupillary surface of the projection optical system. Consequently, the image quality can be improved.

Figure 17A:
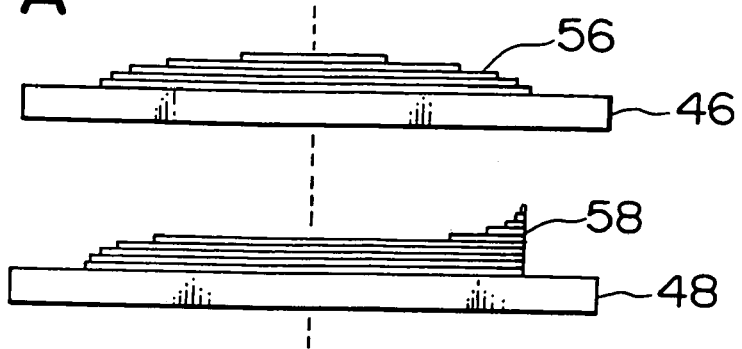
FIGS. 17A and 17B are a sectional view and a perspective view of an aberration eliminating filter embodying the present invention, namely, Embodiment 18 of the present invention.
Figure 17B:
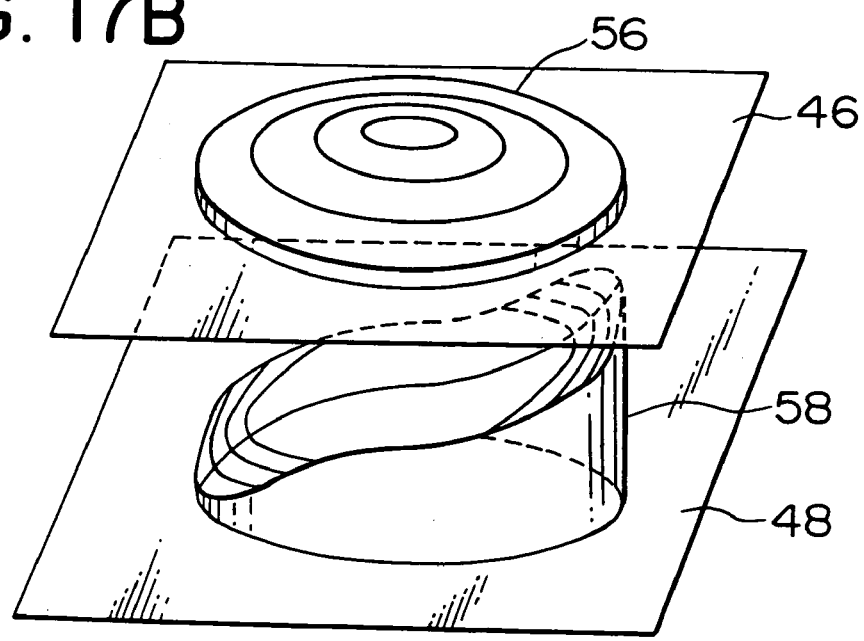

Embodiment 18:

In the case that a plurality of kinds of aberrations coexist, an appropriate combination of some of the aberration eliminating filters described hereinabove as Embodiment 10 to Embodiment 17 may be used. For example, as illustrated in FIGS. 17A and 17B, if the aberration eliminating filter used in Embodiment 15 for compensating for a negative field curvature is combined with the aberration eliminating filter used in Embodiment 17 for compensating for a coma aberration, a negative field curvature and a coma aberration can be simultaneously compensated for. Generally, in an actual optical system, various kinds of aberrations coexist. Thus, all of the various kinds of aberrations can be eliminated by suitably combining the aberration eliminating filters described hereinbefore as Embodiment 10 to Embodiment 17 with one another. Consequently, the image quality can be improved.

Figure 18:
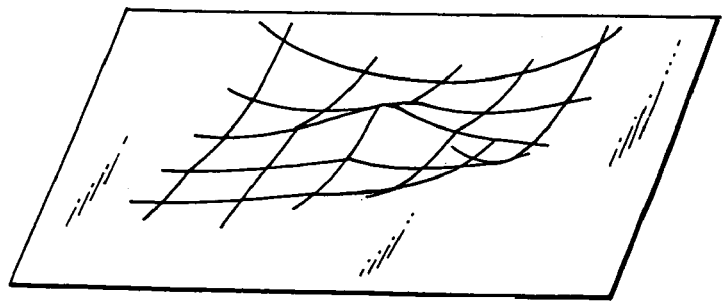
FIG. 18 is a perspective diagram for illustrating a shift in wavefront in the case that various kinds of aberrations are synthesizes in Embodiment 19 of the present invention.
Figure 19:
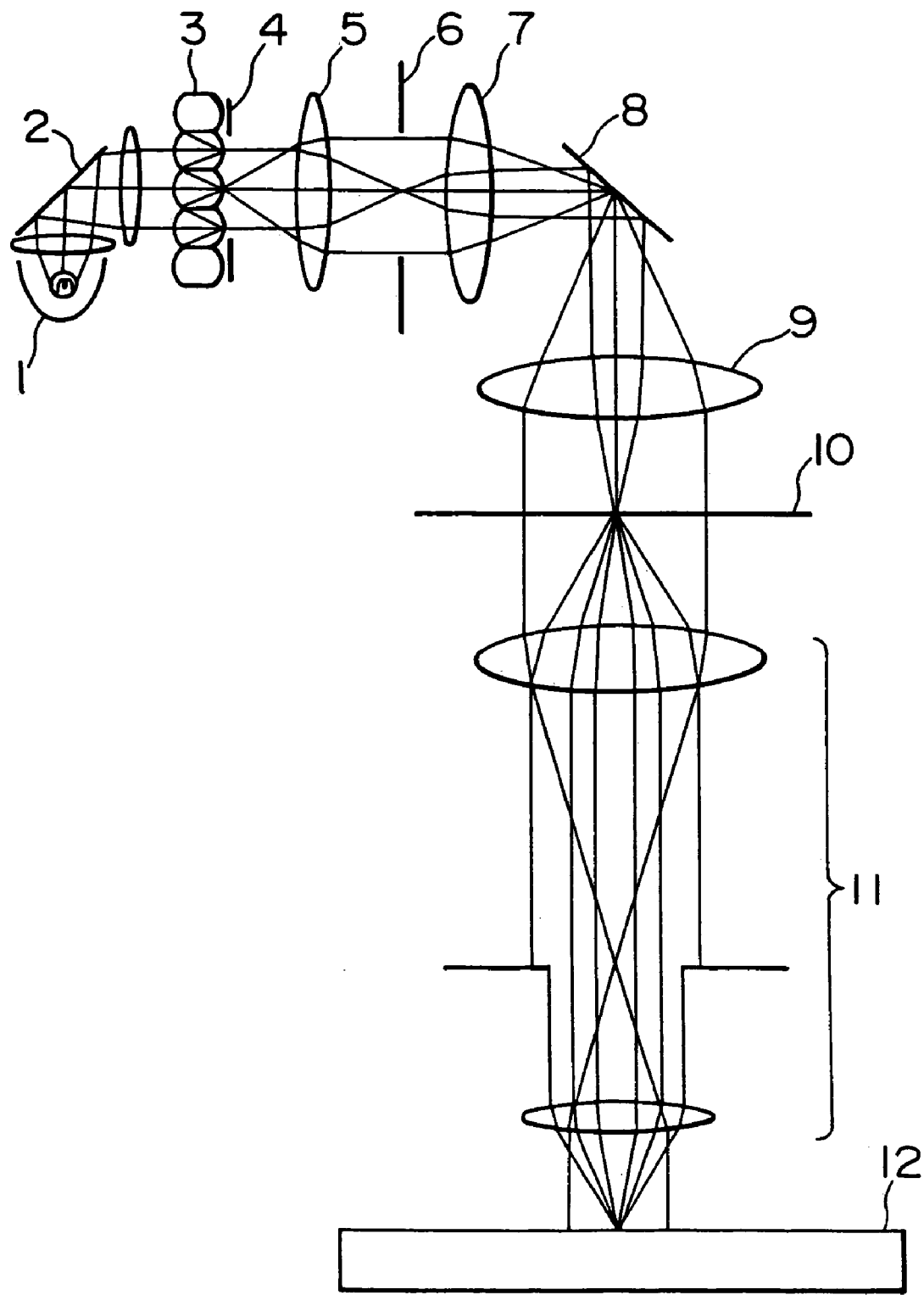
FIG. 19 is a diagram for illustrating the configuration of the conventional projection aligner.

Embodiment 19:

In accordance with the present invention, there can be produced a composite aberration eliminating filter having characteristics compensating for a shift of the wavefront which is obtained by synthesizing the quantities of aberrations, namely, the shifts of the wavefronts estimated by the method of one of Embodiment 4 to Embodiment 8 as illustrated in FIG. 18. For instance, such an aberration eliminating filter can be produced by forming a transparent multi-layer film, which has a sectional shape corresponding to the synthesized shift of the wavefront as illustrated in FIG. 18, on a transparent substrate.

All of the various kinds of aberrations are eliminated by introducing this composite aberration eliminating filter into the projection aligned. The image quality can be enhanced.

What is claimed is:

1. A distortion aberration eliminating filter comprising:

a transparent substrate; and a wave regulating transparent multi-layer film formed on at least one principal plane of the transparent substrate, including multiple layers of different widths so as to form a film thickness of the wave regulating transparent multi-layer film, a film thickness distribution of the wave regulating transparent multi-layer film configured to compensate a distortion aberration of an optical system; wherein the width of at least some of the multiple layers are configured to compensate a distortion aberration having a wavefront aberration proportional to: $\phi = y_0^3 \rho \cos \theta$, wherein:

$\phi$ represents a shift quantity or distance of the wavefront, $y_0$ represents a coordinate measured from a surface of the transparent substrate, $\rho$ represents a radius of a pupillary surface of the wave regulating transparent mutli-layer film, and $\theta$ represents an angle of rotation with respect to a horizontal axis.

2. The distortion aberration eliminating filter according to claim 1, wherein the transparent multi-layer film includes a section, whose film thickness distribution in one direction is represented by a linear function.

3. The distortion aberration eliminating filter according to claim 1, wherein the film thickness distribution of the transparent multi-layer film is configured to eliminate a distortion aberration estimated from a plurality of finished micro patterns and larger patterns by a distortion aberration quantity estimating method.

* * * * *